US011019749B2

(12) United States Patent
Yen et al.

(10) Patent No.: US 11,019,749 B2
(45) Date of Patent: May 25, 2021

(54) APPARATUS AND METHOD THAT MANAGE SENSOR MODULE TEMPERATURE

(71) Applicant: GM GLOBAL TECHNOLOGY OPERATIONS LLC, Detroit, MI (US)

(72) Inventors: Chih-hung Yen, Bloomfield Hills, MI (US); Ljubomir Erakovic, Rochester, MI (US); Taeyoung Han, Bloomfield Hills, MI (US); Bahram Khalighi, Birmingham, MI (US); Jeffrey M Pleune, Rochester Hills, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 232 days.

(21) Appl. No.: 16/122,361

(22) Filed: Sep. 5, 2018

(65) Prior Publication Data

US 2020/0077540 A1    Mar. 5, 2020

(51) Int. Cl.
*H05K 7/20* (2006.01)
*H02J 7/35* (2006.01)
*H02S 99/00* (2014.01)
*G01S 7/497* (2006.01)
*G01S 17/931* (2020.01)

(52) U.S. Cl.
CPC .......... *H05K 7/20172* (2013.01); *G01S 7/497* (2013.01); *G01S 17/931* (2020.01); *H02J 7/35* (2013.01); *H02S 99/00* (2013.01); *H05K 7/20145* (2013.01); *H05K 7/20209* (2013.01); *H05K 7/20863* (2013.01)

(58) Field of Classification Search
CPC ........... H05K 7/20172; H05K 7/20145; H05K 7/20863; H05K 7/20209; G01S 17/931; G01S 7/497; G01S 7/4813; H02S 99/00; H02S 20/30; H02J 7/35; Y02E 10/50; B60L 8/003

See application file for complete search history.

(56) References Cited

U.S. PATENT DOCUMENTS

| | | | |
|---|---|---|---|
| 5,672,101 A * | 9/1997 | Thomas | B60H 1/00428 454/136 |
| 6,173,576 B1 * | 1/2001 | Ishida | F25B 21/02 257/E23.082 |
| 9,885,526 B2 | 2/2018 | Maranville et al. | |
| 9,910,343 B2 | 3/2018 | Carlson | |

(Continued)

FOREIGN PATENT DOCUMENTS

CN    CN201898460 U    7/2011

OTHER PUBLICATIONS

Chinese Office Action for Chinese Application No. 201910473785.7; dated Aug. 11, 2020; pp. 1-8.

*Primary Examiner* — Rexford N Barnie
*Assistant Examiner* — Terrence R Willoughby
(74) *Attorney, Agent, or Firm* — Cantor Colburn LLP (57) ABSTRACT

An apparatus configured to manage the temperature of a sensor module is provided. The apparatus includes a vehicle, a sensor module disposed on top of the vehicle, a solar panel disposed on top of the sensor module, and a gap between the sensor module and solar panel, the gap configured to direct airflow from a front of the vehicle to exit behind the sensor module or the solar panel, the airflow functioning to cool the sensor module or the solar panel.

11 Claims, 5 Drawing Sheets

(56) References Cited

U.S. PATENT DOCUMENTS

| | | |
|---|---|---|
| 10,135,110 B2 | 11/2018 | Lei et al. |
| 2017/0261273 A1* | 9/2017 | Maranville ............... F28F 7/02 |
| 2019/0200519 A1* | 7/2019 | Chrysanthakopoulos ................... A01D 34/008 |
| 2019/0212174 A1* | 7/2019 | Krishnan ................. G01K 7/02 |

* cited by examiner

APPARATUS AND METHOD THAT MANAGE SENSOR MODULE TEMPERATURE

INTRODUCTION

Apparatuses and methods consistent with exemplary embodiments relate to cooling devices. More particularly, apparatuses and methods consistent with exemplary embodiments relate to cooling a sensor module of a vehicle.

SUMMARY

One or more exemplary embodiments provide a vehicle including a sensor module and solar panel with a gap therebetween configured to channel air to cool the sensor module. More particularly, one or more exemplary embodiments provide an apparatus that manages the temperature of a sensor module by using one or more from among a thermoelectric device, a cooling fan, and air flow.

According to an aspect of an exemplary embodiment, an apparatus that manages sensor module temperature is provided. The apparatus includes a vehicle, a sensor module disposed on top of the vehicle; a solar panel disposed on top of the sensor module, and a gap between the sensor module and solar panel, the gap configured to direct airflow from a front of the vehicle to exit behind the sensor module or the solar panel, the airflow functioning to cool the sensor module or the solar panel.

The solar panel may be shaped to reduced drag. In particular, the solar panel may include a front end or a rear end that include one from among a spherical shape, an elliptical shape, or an air foil shape. The solar panel or the sensor module may include supports configured to attach the solar panel to the sensor module.

The sensor module may include vents configured to allow air to flow into the sensor module to cool one or more sensors in the sensor module.

The sensor module may also include at least one thermoelectric device configured to cool one or more sensors in the sensor module.

The sensor module may include at least one fan configured to cool one or more sensors in the sensor module.

The apparatus may include a controller configured to control the at least one fan and the at least one thermoelectric device based on one or more from among a solar intensity parameter, an ambient temperature, vehicle speed, a lidar temperature and a plurality of predetermined lidar temperature operating ranges.

The controller may be configured to power off the at least one fan and the at least one thermoelectric device if the lidar temperature is in a first lidar temperature operating range. In addition, the controller may be further configured to apply power provided by the solar panel to charge a battery or to power vehicle components other than the at least one fan and the at least one thermoelectric device if the lidar temperature is in a first lidar temperature operating range.

The controller may be further configured to run the at least one fan and keep the at least one thermoelectric device off if the lidar temperature is in a second lidar temperature operating range that is greater than the first lidar temperature operating range.

The controller may be further configured to apply power provided by the solar panel to the at least one fan and direct excess power from the solar panel to charge a battery or to power vehicle components other than the at least one fan and the at least one thermoelectric device if the lidar temperature is in a second lidar temperature operating range that is greater than the first lidar temperature operating range.

The controller may be further configured to run both the at least one fan and the at least one thermoelectric device if the lidar temperature is in a third lidar temperature operating range that is greater than the second lidar temperature operating range.

The controller may be further configured to apply power provided by the solar panel to the at least one fan and the at least one thermoelectric device and direct excess power from the solar panel to charge a battery or to power vehicle components other than the at least one fan and the at least one thermoelectric device if the lidar temperature is in a third lidar temperature operating range that is greater than the second lidar temperature operating range.

According to an aspect of an exemplary embodiment, an apparatus that manages sensor module temperature is provided. The apparatus includes a sensor module, a solar panel disposed on top of the sensor module, and a gap between the sensor module and solar panel, the gap configured to direct airflow from a front of the sensor module and to exit behind the sensor module or the solar panel, the airflow functioning to cool the sensor module or the solar panel.

The sensor module may include vents configured to allow air to flow into the sensor module to cool one or more sensors in the sensor module, at least one thermoelectric device configured to cool one or more sensors in the sensor module, and at least one fan configured to cool one or more sensors in the sensor module.

The apparatus may include a controller configured to control the at least one fan and the at least one thermoelectric device based on one or more from among a solar intensity parameter, an ambient temperature, vehicle speed, a lidar temperature and a plurality of predetermined lidar temperature operating ranges.

The controller may be configured to power off the at least one fan and the at least one thermoelectric device if the lidar temperature is in a first lidar temperature operating range.

The controller may be further configured to run the at least one fan and keep the at least one thermoelectric device off if the lidar temperature is in a second lidar temperature operating range that is greater than the first lidar temperature operating range.

The controller may be further configured to run both the at least one fan and the at least one thermoelectric device off if the lidar temperature is in a third lidar temperature operating range that is greater than the second lidar temperature operating range.

Other objects, advantages and novel features of the exemplary embodiments will become more apparent from the following detailed description of exemplary embodiments and the accompanying drawings.

BRIEF DESCRIPTION OF THE DRAWINGS

The disclosed examples will hereinafter be described in conjunction with the following drawing figures, wherein like numerals denote like elements, and wherein.

DETAILED DESCRIPTION

An apparatus configured to manage sensor module temperature will now be described in detail with reference to FIG. 1-5 of the accompanying drawings in which like reference numerals refer to like elements throughout.

The following disclosure will enable one skilled in the art to practice the inventive concept. However, the exemplary embodiments disclosed herein are merely exemplary and do not limit the inventive concept to exemplary embodiments described herein. Moreover, descriptions of features or aspects of each exemplary embodiment should typically be considered as available for aspects of other exemplary embodiments.

It is also understood that where it is stated herein that a first element is "connected to," "attached to," "formed on," or "disposed on" a second element, the first element may be connected directly to, formed directly on or disposed directly on the second element or there may be intervening elements between the first element and the second element, unless it is stated that a first element is "directly" connected to, attached to, formed on, or disposed on the second element. In addition, if a first element is configured to "send" or "receive" information from a second element, the first element may send or receive the information directly to or from the second element, send or receive the information via a bus, send or receive the information via a network, or send or receive the information via intermediate elements, unless the first element is indicated to send or receive information "directly" to or from the second element.

Throughout the disclosure, one or more of the elements disclosed may be combined into a single device or into one or more devices. In addition, individual elements may be provided on separate devices.

Automated or autonomous control systems are being developed and equipped on vehicles. These systems are designed to take over aspects of controlling a vehicle from a human driver. For example, automated or autonomous control systems may control steering, braking, windshield wipers, HVAC systems, charging systems, etc. When a vehicle is operating in automated or autonomous control mode, the vehicle relies on information from sensors to perceive its environment. For example, a camera, a radar, an ultrasonic sensor, and a lidar are all examples of sensors that provide information on an environment to automated or autonomous control systems. Some these sensors may be provided in a sensor rack or sensor module on top of a vehicle.

The placement of the sensor module on top of the vehicle creates additional drag on the vehicle. The drag reduces the energy efficiency of the vehicle. Moreover, the components of the sensor module need to be powered and generate heat when operating. The heat needs to be dissipated and the components of the sensor module need to stay at a temperature within a predetermined range to ensure correct operation of the sensors and the vehicle.

Figure 1:
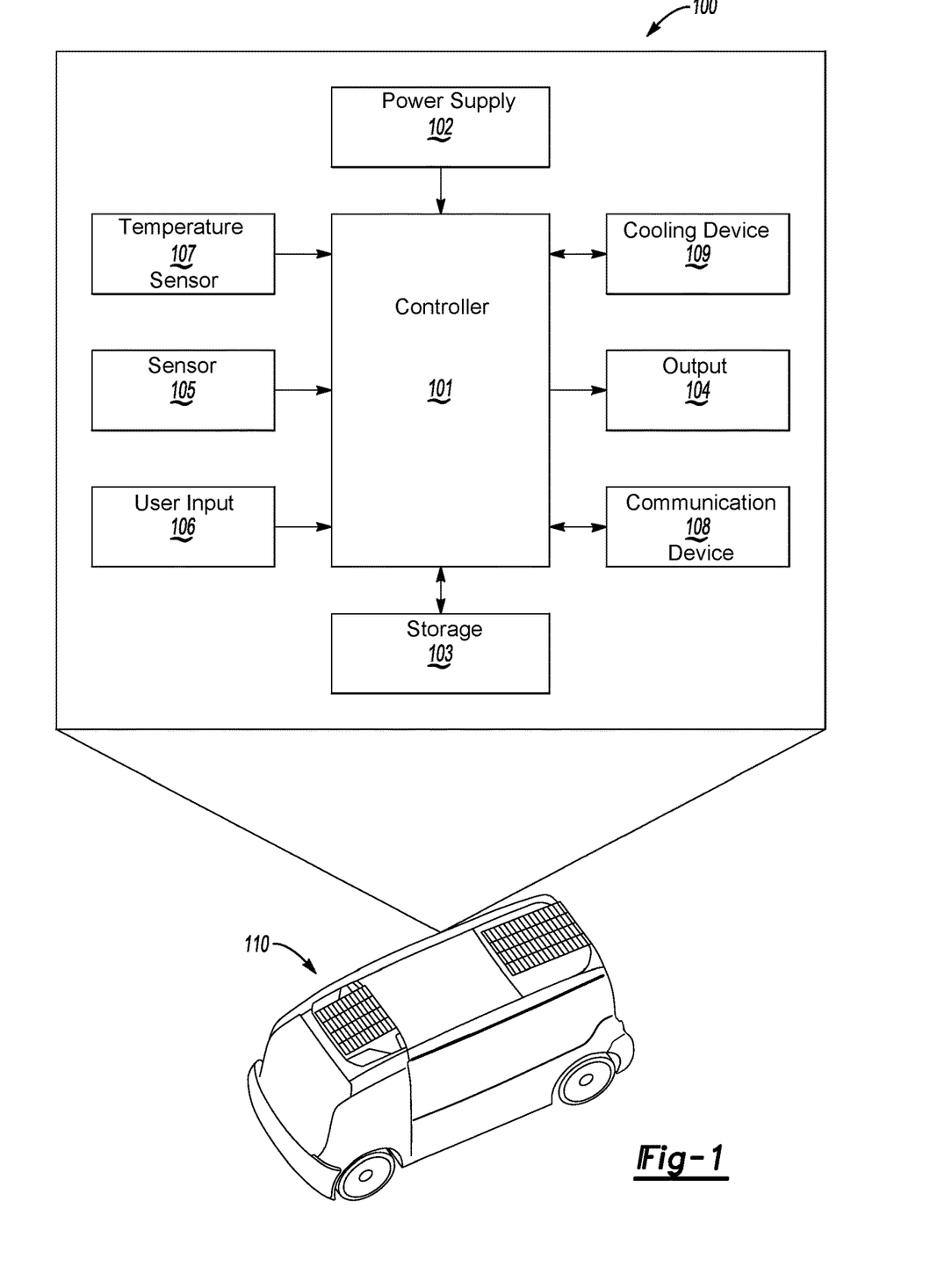
FIG. 1 shows a block diagram of an apparatus that manages sensor module temperature according to an exemplary embodiment.

FIG. 1 shows a block diagram of an apparatus that manages sensor module temperature according to an exemplary embodiment. As shown in FIG. 1, the apparatus configured to manage sensor module temperature 100, according to an exemplary embodiment, includes a controller 101, a power supply 102, a storage 103, an output 104, a sensor 105, a user input 106, a temperature sensor 107, a communication device 108 and a cooling device 109. However, the apparatus configured to manage sensor module temperature 100 is not limited to the aforementioned configuration and may be configured to include additional elements and/or omit one or more of the aforementioned elements. The apparatus configured to manage sensor module temperature 100 may be implemented as part of a vehicle 110, as a standalone component, as a hybrid between an on vehicle and off vehicle device, or in another computing device.

The controller 101 controls the overall operation and function of the apparatus configured to manage sensor module temperature 100. The controller 101 may directly or indirectly control one or more of a power supply 102, a storage 103, an output 104, a sensor 105, a user input 106, a temperature sensor 107, a communication device 108 and a cooling device 109, of the apparatus configured to manage sensor module temperature 100. The controller 101 may include one or more from among a processor, a microprocessor, a central processing unit (CPU), a graphics processor, Application Specific Integrated Circuits (ASICs), Field-Programmable Gate Arrays (FPGAs), state machines, circuitry, and a combination of hardware, software and firmware components.

The controller 101 is configured to send and/or receive information from one or more of the power supply 102, the storage 103, the output 104, the sensor 105, the user input 106, the temperature sensor 107, the communication device 108 and the cooling device 109 of the apparatus configured to manage sensor module temperature 100. The information may be sent and received via a bus or network, or may be directly read or written to/from one or more of the power supply 102, the storage 103, the output 104, the sensor 105, the user input 106, the temperature sensor 107, the communication device 108 and the cooling device 109 of the apparatus configured to manage sensor module temperature 100. Examples of suitable network connections include a controller area network (CAN), a media oriented system transfer (MOST), a local interconnection network (LIN), a local area network (LAN), wireless networks such as Bluetooth and 802.11, and other appropriate connections such as Ethernet.

The power supply 102 provides power to one or more of the storage 103, the output 104, the sensor 105, the user input 106, the temperature sensor 107, the communication device 108 and the cooling device 109, of the apparatus configured to manage sensor module temperature 100. The power supply 102 may include one or more from among a battery, an outlet, a capacitor, a solar energy cell, a solar panel, a generator, a wind energy device, an alternator, etc.

The storage 103 is configured for storing information and retrieving information used by the apparatus configured to manage sensor module temperature 100. The storage 103 may be controlled by the controller 101 to store and retrieve information received from one or more sensors 105, the temperature sensor 107, as well as computer or machine executable instructions to control the cooling device 109. The storage 103 may include one or more from among floppy diskettes, optical disks, CD-ROMs (Compact Disc-Read Only Memories), magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, cache memory, and other type of media/machine-readable medium suitable for storing machine-executable instructions.

The storage 103 may store information on one or more from among a solar intensity parameter, an ambient temperature, vehicle speed, a lidar temperature and a plurality of predetermined lidar temperature operating ranges. The solar intensity parameter may be solar irradiance provided by a solar radiation sensor. The vehicle speed may be information provided by a wheel speed sensor, GPS sensor, etc. The lidar temperature and ambient temperature may be provided by thermometers or a temperature sensor. The plurality of predetermined lidar temperature operating ranges may be preset temperature ranges corresponding to the type of cooling that needs to be active to allow the lidar or other sensors in the sensor module to operate in the respective temperature range. The storage 103 may also store machine-readable instructions executable to implement the apparatus configured to manage sensor module temperature 100.

The output 104 outputs information in one or more forms including: visual, audible and/or haptic form. The output 104 may be controlled by the controller 101 to provide outputs to the user of the apparatus configured to manage sensor module temperature 100. The output 104 may include one or more from among a speaker, audio, a display, a centrally-located display, a head up display, a windshield display, a haptic feedback device, a vibration device, a tactile feedback device, a tap-feedback device, a holographic display, an instrument light, an indicator light, etc. The output 104 may output notification including one or more from among an audible notification, a light notification, and a display notification. The notification may include information notifying of the activation of the cooling device 109, notification of a temperature of one or more sensors in the sensor module, a notification corresponding to battery charging or battery power. The output 104 may also display images and information provided by one or more sensors 105.

The sensor 105 may include one or more from among a lidar, a radar, a solar radiation sensor, an ultrasonic sensor, a video camera, a still image camera, an antenna, an infrared camera, and any other sensor suitable for perceiving an environment around a vehicle or other machine. The sensor 105 may be part of a sensor module.

The solar radiation sensor may include one or more photovoltaic sensors. The photovoltaic sensor may comprise a sensing element packaged in a spherical housing made of translucent plastic that passes attenuated visible light. The sensing element produces an electrical voltage that varies with the intensity of the impinging light, and the controller uses the voltage as a measure of solar loading or solar irradiance.

The user input 106 is configured to provide information and commands to the apparatus configured to manage sensor module temperature 100. The user input 106 may be used to provide user inputs, etc., to the controller 101. The user input 106 may include one or more from among a touchscreen, a keyboard, a soft keypad, a button, a motion detector, a voice input detector, a microphone, a camera, a trackpad, a mouse, a touchpad, etc. The user input 106 may be configured to receive a user input to acknowledge or dismiss the notification output by the output 104. The user input 106 may also be configured to receive a user input to activate or deactivate the cooling device 109.

The temperature sensor 107 may include one or more temperature sensors such as a thermometer. The temperature sensor 107 may provide information on one or more from among solar intensity, ambient temperature, respective temperatures of the components of the sensor module, lidar temperature, and camera temperature.

The communication device 108 may be used by apparatus configured to manage sensor module temperature 100 to communicate with several types of external apparatuses according to various communication methods. The communication device 108 may be used to send/receive various information such as information on operation mode of the vehicle and control information for operating the apparatus configured to manage sensor module temperature 100 to/from the controller 101. For example, the communication device 108 may send/receive a solar intensity parameter, an ambient temperature, vehicle speed, a lidar temperature and a plurality of predetermined lidar temperature operating ranges.

The communication device 108 may include various communication modules such as one or more from among a telematics unit, a broadcast receiving module, a near field communication (NFC) module, a GPS receiver, a wired communication module, or a wireless communication module. The broadcast receiving module may include a terrestrial broadcast receiving module including an antenna to receive a terrestrial broadcast signal, a demodulator, and an equalizer, etc. The NFC module is a module that communicates with an external apparatus located at a nearby distance according to an NFC method. The GPS receiver is a module that receives a GPS signal from a GPS satellite and detects a current location. The wired communication module may be a module that receives information over a wired network such as a local area network, a controller area network (CAN), or an external network. The wireless communication module is a module that is connected to an external network by using a wireless communication protocol such as IEEE 802.11 protocols, WiMAX, Wi-Fi or IEEE communication protocol and communicates with the external network. The wireless communication module may further include a mobile communication module that accesses a mobile communication network and performs communication according to various mobile communication standards such as 3rd generation (3G), $3^{rd}$ generation partnership project (3GPP), long-term evolution (LTE), Bluetooth, EVDO, CDMA, GPRS, EDGE or ZigBee.

The cooling device 109 may be a fan or a thermoelectric device disposed in the sensor module. The thermoelectric device may be attached to a lidar or another component in the sensor module. The fan may be configured to direct air into the sensor module and at one or more components of the sensor module.

According to an example, the controller 101 of the apparatus configured to manage sensor module temperature 100 may be configured to control the cooling device 109, including at least one fan and at least one thermoelectric device, based on one or more from among a solar intensity parameter, an ambient temperature, vehicle speed, a lidar temperature and a plurality of predetermined lidar temperature operating ranges.

According to an example, the controller 101 of the apparatus configured to manage sensor module temperature 100 may be configured to power off the at least one fan and the at least one thermoelectric device if the lidar temperature is in a first lidar temperature operating range. According to another example, the controller 101 of the apparatus configured to manage sensor module temperature 100 may be further configured to run the at least one fan and keep the at least one thermoelectric device off if the lidar temperature is in a second lidar temperature operating range that is greater than the first lidar temperature operating range. According to yet another example, the controller 101 of the apparatus configured to manage sensor module temperature 100 may be further configured to run both the at least one fan and the at least one thermoelectric device off if the lidar temperature is in a third lidar temperature operating range that is greater than the second lidar temperature operating range.

According to an example, the controller 101 of the apparatus configured to manage sensor module temperature 100 may be configured to apply power provided by the solar panel to charge a battery or to power vehicle components other than the at least one fan and the at least one thermoelectric device if the lidar temperature is in a first lidar temperature operating range. According to another example, the controller 101 of the apparatus configured to manage sensor module temperature 100 may be further configured to apply power provided by the solar panel to the at least one fan and direct excess power from the solar panel to charge a battery or to power vehicle components other than the at least one fan and the at least one thermoelectric device if the lidar temperature is in a second lidar temperature operating range that is greater than the first lidar temperature operating range. According to yet another example, the controller 101 of the apparatus configured to manage sensor module temperature 100 may be further configured to apply power provided by the solar panel to the at least one fan and direct excess power from the solar panel to charge a battery or to power vehicle components other than the at least one fan and the at least one thermoelectric device if the lidar temperature is in a third lidar temperature operating range that is greater than the second lidar temperature operating range.

Figure 2:
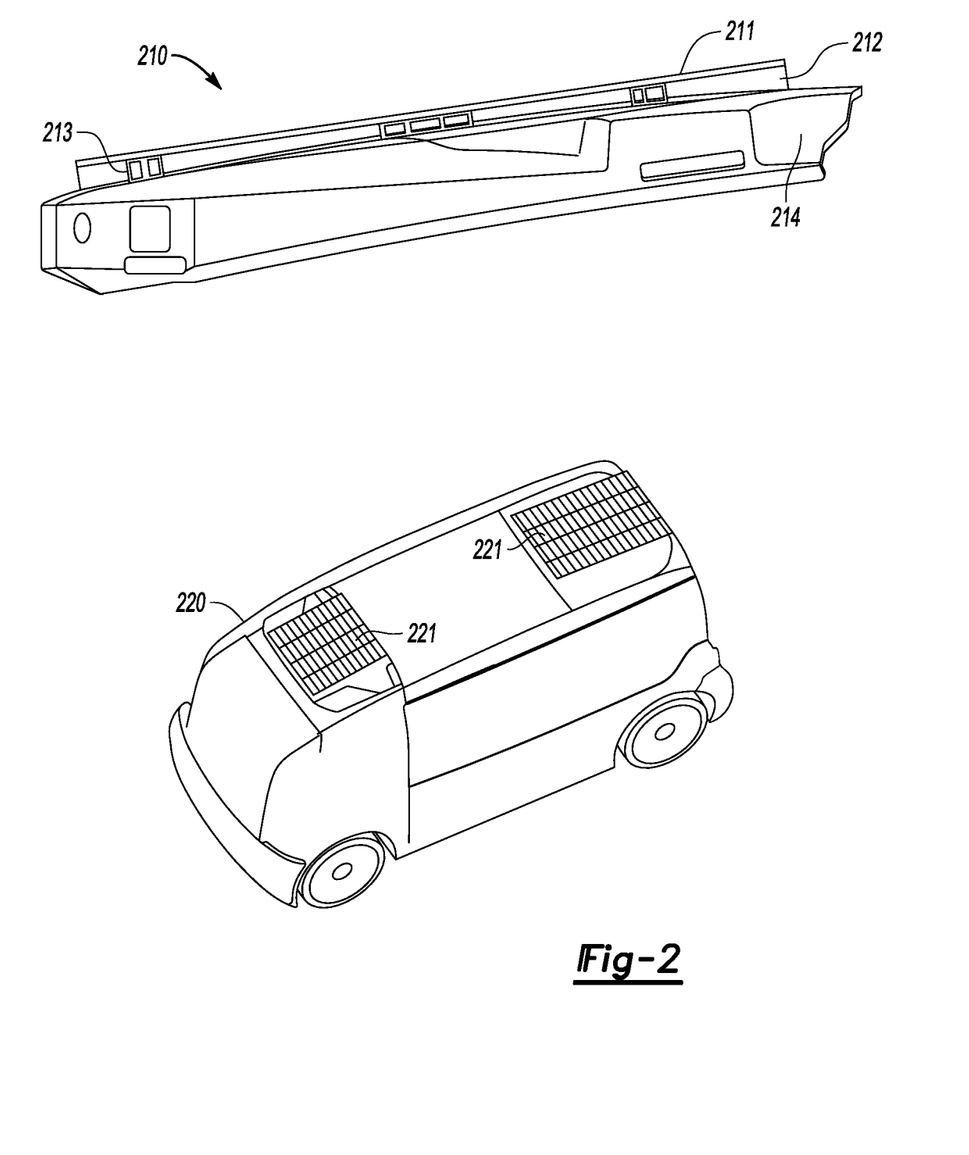
FIG. 2 shows an illustration of an apparatus that manages sensor module temperature and a vehicle according to an aspect of an exemplary embodiment.

FIG. 2 shows an illustration of an apparatus that manages sensor module temperature and a vehicle according to an aspect of an exemplary embodiment. Referring to FIG. 2, a sensor module 210 and a vehicle 220 that includes the sensor module 210 are shown.

The sensor module 210 may include a solar panel 211, a sensor rack 214, and a gap between the solar panel 211 and the sensor rack 214. In addition, the sensor module 210 may include or more supports 213 attached to the sensor rack 214 and the solar panel 211 configured to hold the solar panel 211 above the sensor rack 214 thereby creating the gap 212 between the solar panel 211 and the senor module 210.

The vehicle 220 may include two sensor modules 221, one facing a front side and one facing a rear of the vehicle 220. The two sensor modules 221 may be positioned in such a way that the front sensor module 221 is in inclined toward the front of vehicle 220 and the rear sensor module is included toward the rear of vehicle 220.

Figure 3:
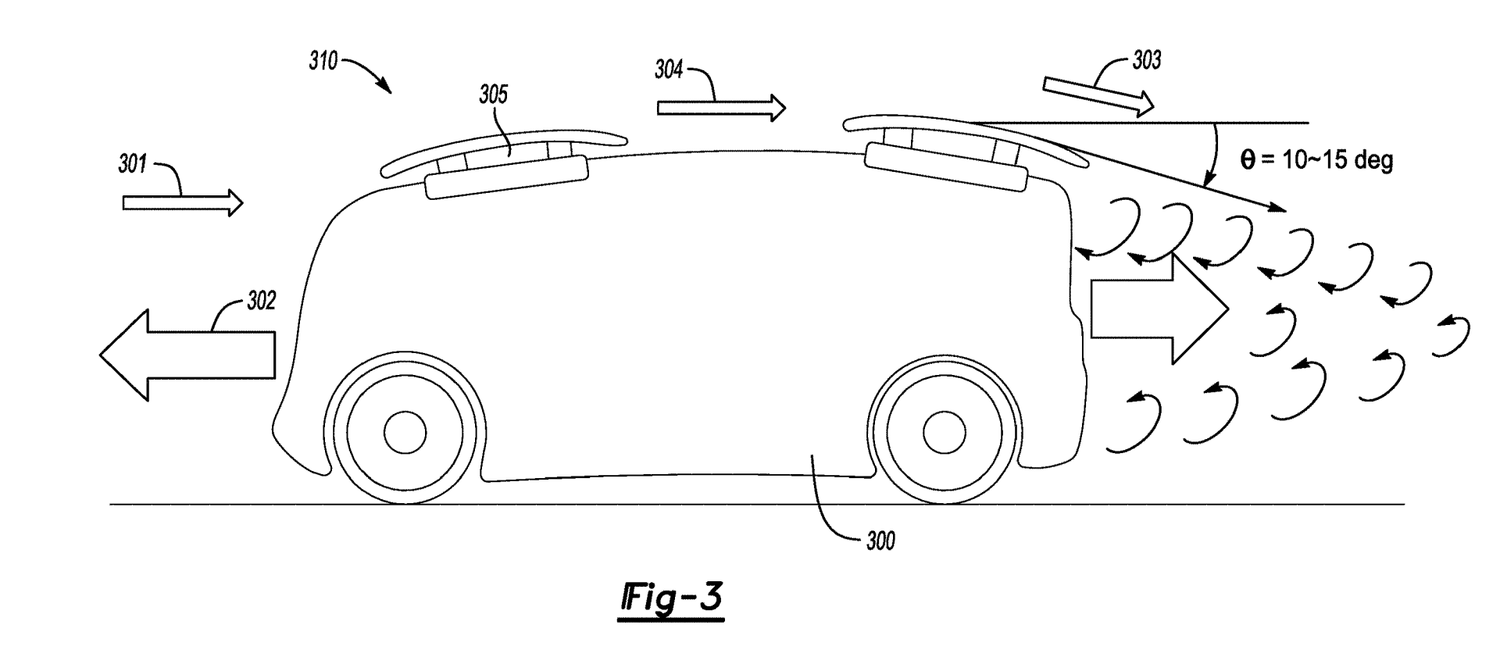
FIG. 3 shows an illustration of airflow with respect to a vehicle including an apparatus that manages sensor module temperature according to an aspect of an exemplary embodiment.

FIG. 3 shows an illustration of airflow with respect to a vehicle including an apparatus that manages sensor module temperature according to an aspect of an exemplary embodiment. Referring to FIG. 3, drag is created as a vehicle 300 is moving.

A vehicle 300 may be moving forward 302 creates drag due to a low-pressure area 303 behind the vehicle. Positioning sensor modules 305 in a manner that reduces the drag of the front sensor module. As shown in FIG. 3, airflow 301 may be redirected to flow 304 through a gap 305 between the solar panel and the sensor rack by having a spherical shape, an elliptical shape, or an air foil shape of the solar panel to reduce the drag from the front sensor module.

The gap 305 shown in FIG. 3 may be configured to prevent direct solar load to the sensor module when vehicle is parked. In addition, the gap 305 may help shade the sensor module.

As shown in FIG. 3, airflow 304 may be controlled and redirected by the aerodynamic spoiler shape of the rear solar panel with an optimum angle between 10 and 15 degrees to maximize the pressure recovery in the wake, thereby reducing low pressure area 303 and reducing drag.

Figure 4:
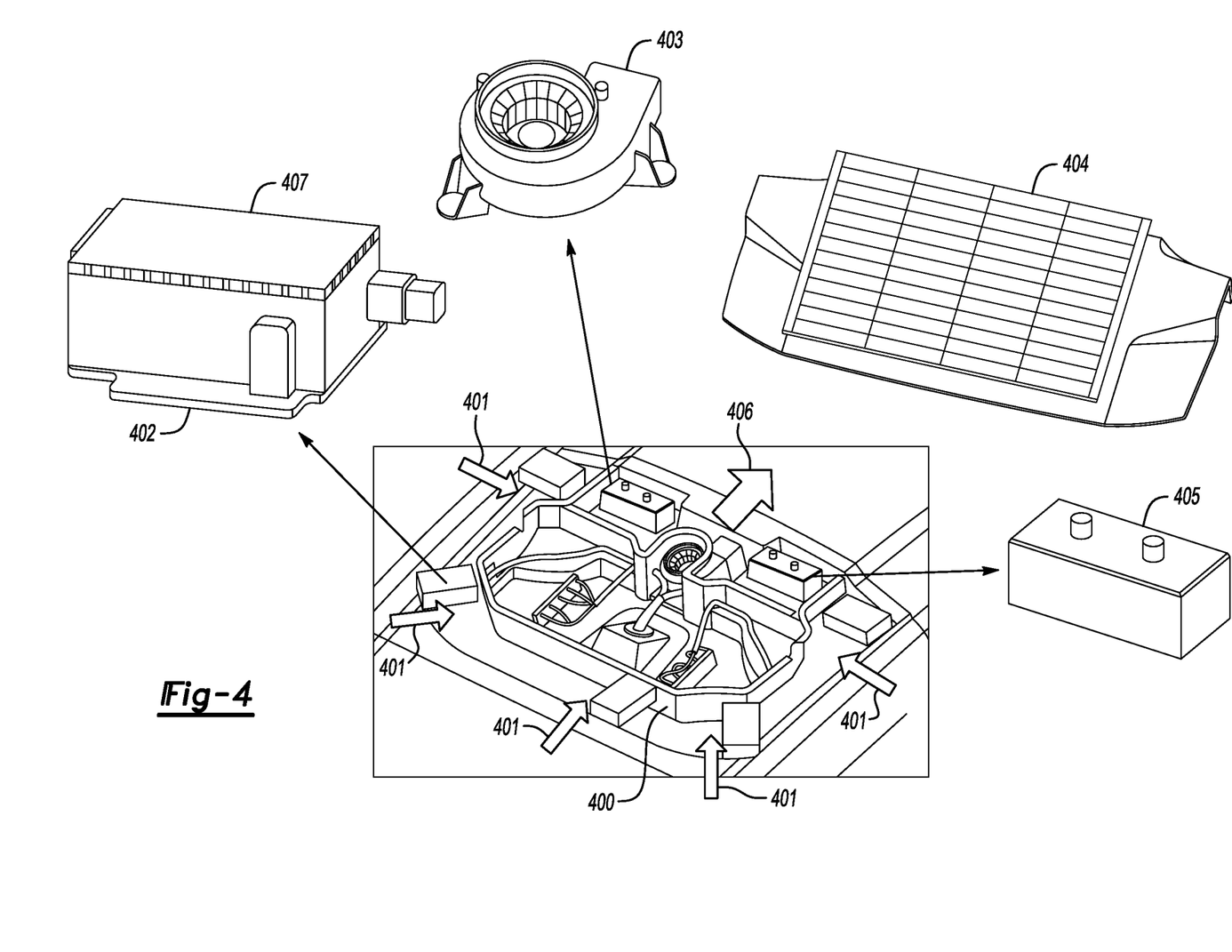
FIG. 4 shows an illustration of a sensor module and various components according to an aspect of an exemplary embodiment.

FIG. 4 shows an illustration of a sensor module and various components according to an aspect of an exemplary embodiment. Referring to FIG. 4, a sensor module 400 including various components is shown.

The sensor module 400 may include one or more intake vents 401 configured to receive airflow and direct the airflow through channels to cool the components of the sensor module 400 and one or more exhaust vents 406 configured to allow the heated air to exit the sensor module 400. In addition, the sensor module 400 may include a solar panel 404, one or more lidar units 402, one or more batteries 405, one or more cooling fans/blowers 403, and one or more thermoelectric devices 407.

The one or more cooling fans/blowers 403 may be configured to intake air through vents 401 and/or exhaust heated air through exhaust vents 406. The one or more batteries 405 configured to store energy provided by the solar panel 404 and to power one or more components of the sensor module 400. The one or more thermoelectric devices 407 may be attached to various parts, structures and components of the sensor module 400 and may be powered to cool the sensor module 400 and the one or more components of the sensor module.

Figure 5:
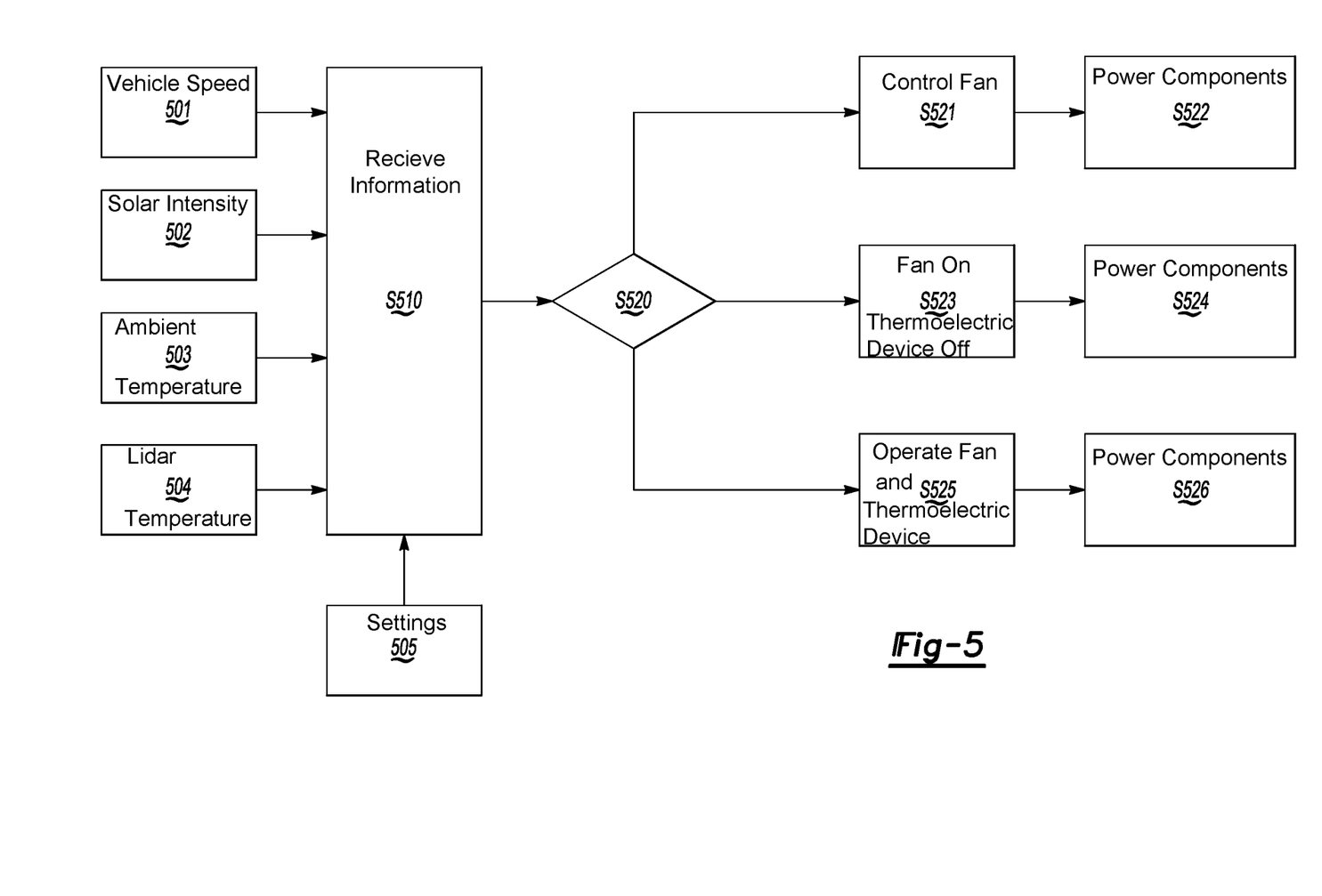
FIG. 5 shows a flow diagram of a method that manages sensor module temperature according to an exemplary embodiment.

FIG. 5 shows a flow diagram of a method that manages sensor module temperature according to an exemplary embodiment.

Referring to FIG. 5, the controller 101 receives information provided by sensors corresponding to a plurality of conditions 501-504 and a plurality of settings 505 in operation S510. For example, the controller may receive information on one or more from among a solar intensity parameter, an ambient temperature, vehicle speed, a lidar temperature and from vehicle sensors 105 and temperature sensors 107, and a plurality of predetermined lidar temperature operating ranges from storage 103.

In operation S520, the controller 101 may determine the mode based on received information. For example, the controller may power off or keep the at least one fan and the at least one thermoelectric device in operation S521 and control to apply power provided by the solar panel to charge a battery or to power vehicle components other than the at least one fan and the at least one thermoelectric device in operation S522 if the controller 101 determines that the lidar temperature is in a first lidar temperature operating range in operation S520.

Moreover, the controller may control to operate the at least one fan and keep the at least one thermoelectric device off, or vice versa, in operation S523 and control to apply power provided by the solar panel to the at least one fan or the at least one thermoelectric device and direct excess power from the solar panel to charge a battery or to power vehicle components other than the at least one fan or the at least one thermoelectric device in operation S524 if the controller 101 determines that the lidar temperature is in a second lidar temperature operating range greater than the first lidar temperature operating range in operation S520.

In addition, the controller may control to operate both the at least one fan and the at least one thermoelectric device in operation S525 and control to apply power provided by the solar panel to the at least one fan and the at least one thermoelectric device and direct excess power from the solar panel to charge a battery or to power vehicle components other than the at least one fan or the at least one thermoelectric device in operation S526 if the controller 101 determines that the lidar temperature is in a third lidar temperature operating range greater than the second lidar temperature operating range in operation S520.

The processes, methods, or algorithms disclosed herein can be deliverable to or implemented by a processing device, controller, or computer, which can include any existing programmable electronic control device or dedicated electronic control device. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

One or more exemplary embodiments have been described above with reference to the drawings. The exemplary embodiments described above should be considered in a descriptive sense only and not for purposes of limitation. Moreover, the exemplary embodiments may be modified without departing from the spirit and scope of the inventive concept, which is defined by the following claims.

What is claimed is:

1. An apparatus that manages sensor module temperature, the apparatus comprising:
    a vehicle; and
    a sensor module including a solar panel and a sensor rack disposed on top of the vehicle, the sensor module further including vents configured to allow air to flow into the sensor module, least one thermoelectric device, and at least one fan, wherein the air, the at least one thermoelectric device, and the fan are configured to cool one or more sensors in the sensor module, the solar panel being spaced from the sensor rack by a gap configured to direct airflow from a front of the vehicle through a space between the sensor rack and the solar panel defined by the gap to exit behind the sensor module, the airflow functioning to cool at least one of the sensor rack and the solar panel; and
    a controller configured to control the at least one fan and the at least one thermoelectric device based on one or more of a solar intensity parameter, an ambient temperature, vehicle speed, a lidar temperature, and a plurality of predetermined lidar temperature operating ranges,
    wherein the controller is configured to power off the at least one fan and the at least one thermoelectric device if the lidar temperature is in a first lidar temperature operating range, and
    wherein the controller is further configured to apply power provided by the solar panel to charge a battery or to power vehicle components other than the at least one fan and the at least one thermoelectric device if the lidar temperature is in the first lidar temperature operating range.

2. The apparatus of claim 1, wherein the solar panel is shaped to reduced drag.

3. The apparatus of claim 2, wherein the solar panel comprises a front end or a rear end that include one from among a spherical shape, an elliptical shape, or an air foil shape.

4. The apparatus of claim 1, further comprising supports configured to attach the solar panel to the sensor rack.

5. The apparatus of claim 1, wherein the controller is further configured to run the at least one fan and keep the at least one thermoelectric device off if the lidar temperature is in a second lidar temperature operating range that is greater than the first lidar temperature operating range.

6. The apparatus of claim 5, wherein the controller is further configured to apply power provided by the solar panel to the at least one fan and direct excess power from the solar panel to charge a battery or to power vehicle components other than the at least one fan and the at least one thermoelectric device if the lidar temperature is in a second lidar temperature operating range that is greater than the first lidar temperature operating range.

7. The apparatus of claim 5, wherein the controller is further configured to run both the at least one fan and the at least one thermoelectric device if the lidar temperature is in a third lidar temperature operating range that is greater than the second lidar temperature operating range.

8. The apparatus of claim 7, wherein the controller is further configured to apply power provided by the solar panel to the at least one fan and the at least one thermoelectric device and direct excess power from the solar panel to charge a battery or to power vehicle components other than the at least one fan and the at least one thermoelectric device if the lidar temperature is in a third lidar temperature operating range that is greater than the second lidar temperature operating range.

9. An apparatus that manages sensor module temperature, the apparatus comprising:
    a sensor module including a solar panel and a sensor rack, the sensor module further including vents configured to allow air to flow into the sensor module, least one thermoelectric device, and at least one fan, wherein the air, the at least one thermoelectric device, and the fan are configured to cool one or more sensors in the sensor module;
    a gap disposed between the sensor rack and solar panel, the gap configured to direct airflow from a front of the sensor rack through a space between the sensor rack and the solar panel defined by the gap and to exit behind the sensor module, the airflow functioning to cool at least one of the sensor rack and the solar panel; and
    a controller configured to control the at least one fan and the at least one thermoelectric device based on one or more of a solar intensity parameter, an ambient temperature, vehicle speed, a lidar temperature, and a plurality of predetermined lidar temperature operating ranges,
    wherein the controller is configured to power off the at least one fan and the at least one thermoelectric device if the lidar temperature is in a first lidar temperature operating range, and
    wherein the controller is further configured to apply power provided by the solar panel to charge a battery or to power vehicle components other than the at least one fan and the at least one thermoelectric device if the lidar temperature is in the first lidar temperature operating range.

10. The apparatus of claim 9, wherein the controller is further configured to run the at least one fan and keep the at least one thermoelectric device off if the lidar temperature is in a second lidar temperature operating range that is greater than the first lidar temperature operating range.

11. The apparatus of claim 9, wherein the controller is further configured to run both the at least one fan and the at least one thermoelectric device off if the lidar temperature is in a third lidar temperature operating range that is greater than the second lidar temperature operating range.

* * * * *